(12) United States Patent
Berrettini et al.

(10) Patent No.: US 8,134,777 B2
(45) Date of Patent: Mar. 13, 2012

(54) OPTICAL SWITCH ASSEMBLY AND NETWORK INCORPORATING SAME

(75) Inventors: Gianluca Berrettini, Pisa (IT); Antonella Bogoni, Montova (IT); Luca Poti, Pisa (IT)

(73) Assignee: Telefonaktiebolaget LM Ericsson (publ), stockholm (SE)

( * ) Notice: Subject to any disclaimer, the term of this patent is extended or adjusted under 35 U.S.C. 154(b) by 383 days.

(21) Appl. No.: 12/442,268

(22) PCT Filed: Sep. 22, 2006

(86) PCT No.: PCT/EP2006/009251
§ 371 (c)(1), (2), (4) Date: Sep. 25, 2009

(87) PCT Pub. No.: WO2008/034459
PCT Pub. Date: Mar. 27, 2008

(65) Prior Publication Data
US 2010/0033807 A1    Feb. 11, 2010

(51) Int. Cl.
*H01S 5/00*   (2006.01)
*H04J 14/00*  (2006.01)
*H04B 10/12*  (2006.01)

(52) U.S. Cl. .............. 359/344; 398/45; 398/50

(58) Field of Classification Search .......... 359/344; 398/45, 50
See application file for complete search history.

(56) References Cited

U.S. PATENT DOCUMENTS

| | | | |
|---|---|---|---|
| 5,013,113 A | 5/1991 | Soref | |
| 5,136,670 A * | 8/1992 | Shigematsu et al. | 385/42 |
| 5,283,844 A | 2/1994 | Rice et al. | |
| 5,999,293 A * | 12/1999 | Manning | 398/52 |
| 6,522,462 B2 * | 2/2003 | Chu et al. | 359/344 |
| 6,650,800 B2 * | 11/2003 | Litvin | 385/15 |
| 6,765,715 B1 * | 7/2004 | DiJaili et al. | 359/344 |
| 2003/0002797 A1 * | 1/2003 | Chu et al. | 385/39 |
| 2003/0190109 A1 * | 10/2003 | Litvin | 385/15 |

FOREIGN PATENT DOCUMENTS
EP    0442518 A2    8/1991

* cited by examiner

*Primary Examiner* — Eric Bolda
(74) *Attorney, Agent, or Firm* — Coats & Bennett, PLLC

(57) ABSTRACT

An optical switch assembly comprising at least two optical amplifiers (10, 20), means for applying a first input signal to one end of both amplifiers (10, 20) and a second input signal to another end, and means for simultaneously driving one or other of the amplifiers into a saturated state whilst the other is unsaturated such that only the amplifier that is unsaturated provides any significant amplification to the input signals at each end, and means for feeding the amplified output signals from the amplifiers to at least two output nodes such that the two amplifiers (10, 20) are connected to the two output nodes in opposite connections.

8 Claims, 5 Drawing Sheets

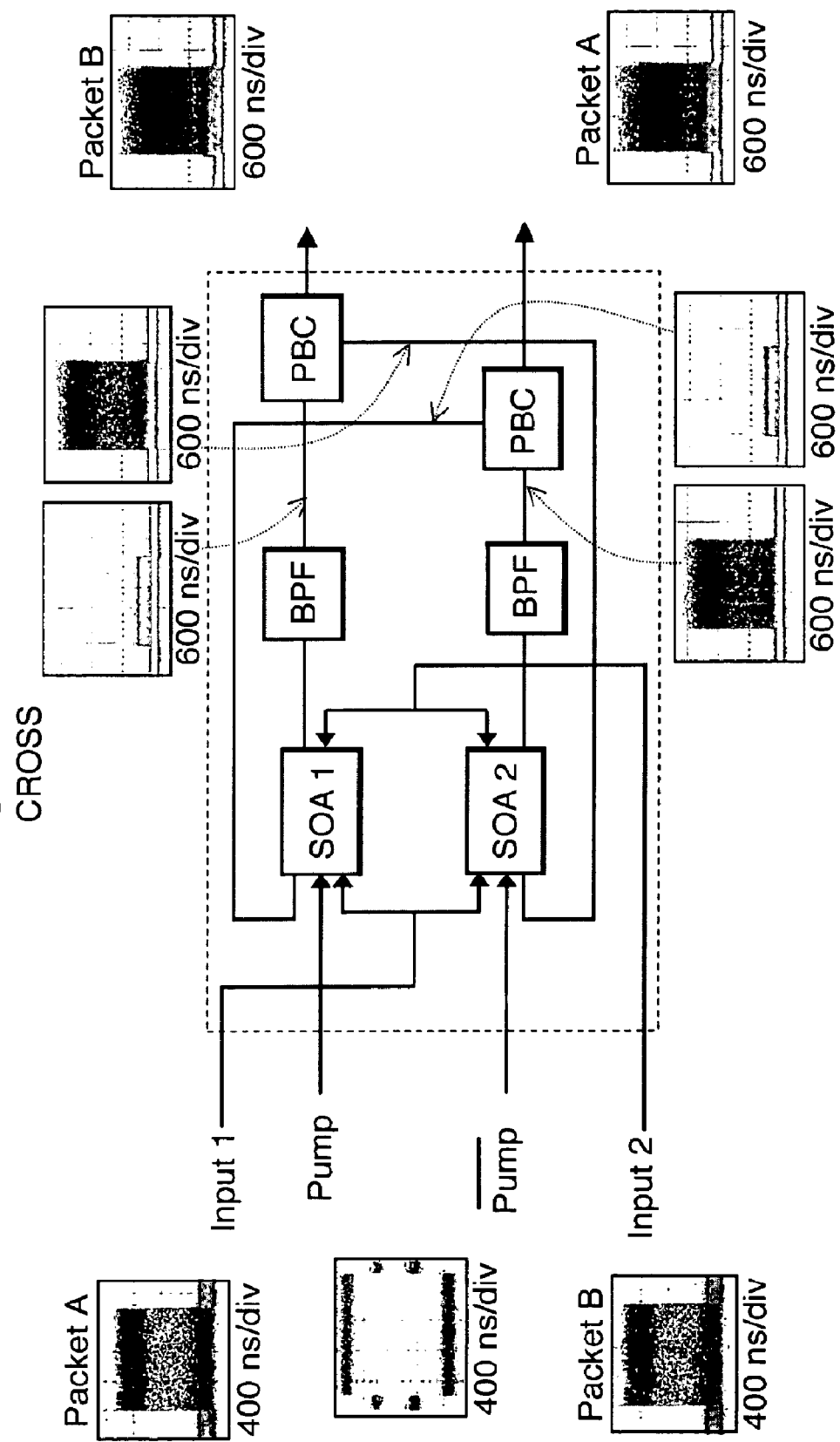
Fig.1(b). CROSS

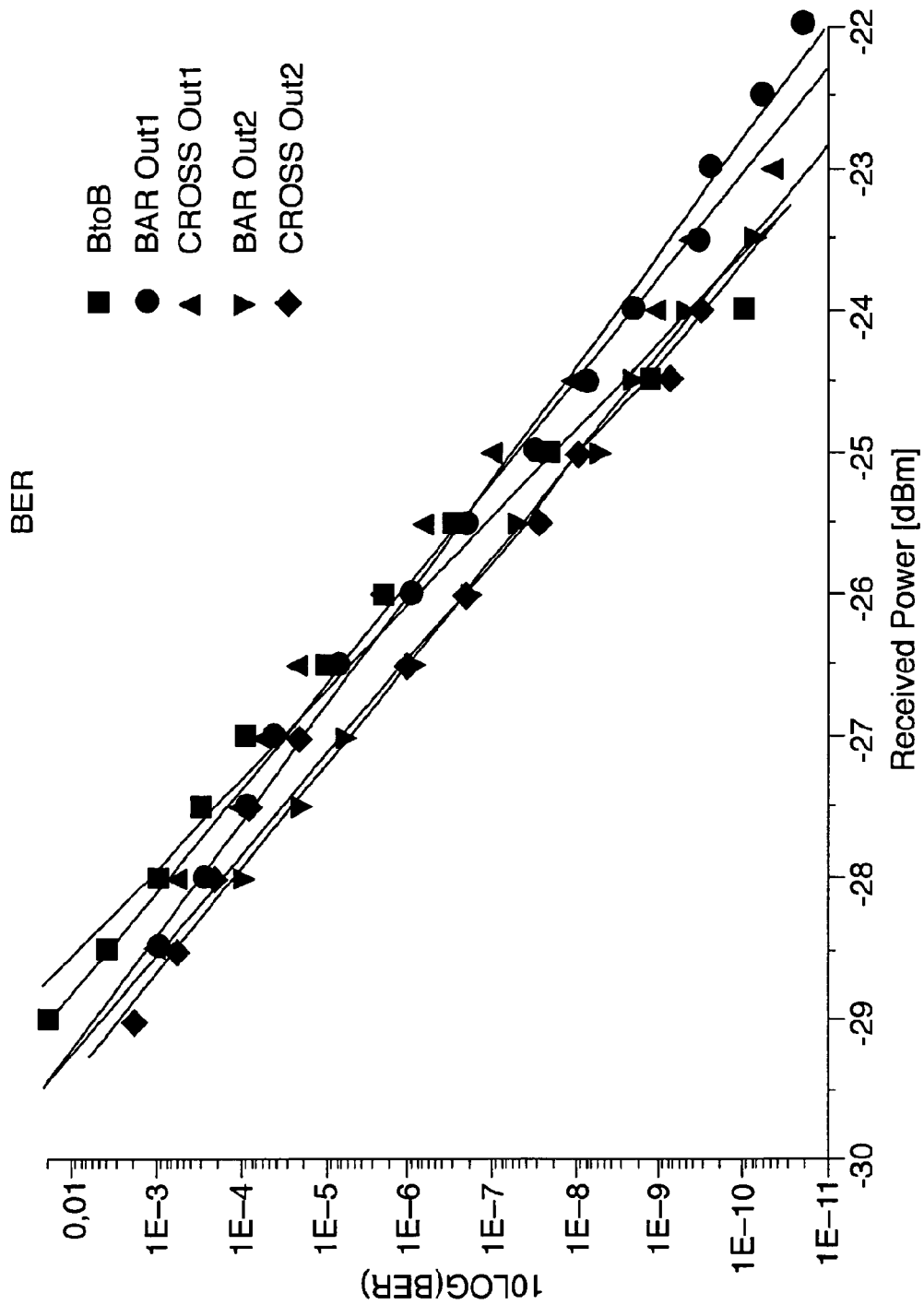

OPTICAL SWITCH ASSEMBLY AND NETWORK INCORPORATING SAME

FIELD OF THE INVENTION

This invention relates to optical switch assemblies and to networks incorporating such assemblies. It in particular relates to all optical switch assemblies that are suited to switching of packetised data streams having high bit rates.

BACKGROUND OF THE INVENTION

The very high bandwidth of optical fibres has caused a great increase in data transmission speeds within networks over the past decade. In many systems the optical signals are converted into electrical signals at connection nodes. The routing of the data around the network is then performed in the electrical domain by analysing the electronic signals. This places a limit on the speeds that can be obtained, since electrical signal processing and operation of electrical switches is inherently slow relative to all optical processing.

Various optical routers are known, perhaps the most widely used being optical amplifiers which can be placed at nodes in a network to increase the transmission length of the network. These devices boost the level of the signal, allowing long distances to be traversed despite transmission losses. However, such devices do not switch the path of the signals around the network.

Several attempts have been made to provide all optical switches but to date the applicant is not aware of any devices which can be successfully integrated into an optical transmission network. Devices which use interferometric principles have been proposed which can perform two by two switching, but they are as yet not widely established.

The function of a two by two (2×2) switch assembly is to divert incoming data streams onto one of two output paths. The switch typically operates between two configurations: a bar state and a cross-over configuration. In the bar configuration the first input stream is passed to a first output path, and the second input stream to a second output path. In the cross-over configuration the first input stream is passed to the second output path and the second input stream to the first path. The state of the switch is determined by reading the routing information contained within the incoming data packets, typically by electronic processing of the signals.

SUMMARY OF THE INVENTION

According to a first aspect the invention provides an optical switch assembly comprising at least two optical amplifiers, means for applying a first input signal to one end of both amplifiers and a second input signal to another end, and means for simultaneously driving one or other of the amplifiers into a saturated state whilst the other is unsaturated such that only the amplifier that is unsaturated provides any significant amplification to the input signals at each end, and means for feeding the amplified output signals from the amplifiers to at least two output nodes such that the two amplifiers are connected to the two output nodes in opposite connections.

By connected in opposite ways connections we mean that the first end of one amplifier and the second end of the other are connected together at one node, and the second end of that amplifier and the first end of the other are connected together at the other output node.

The assembly may more specifically comprise at least two semiconductor amplifiers, each having an input node and an output node.

It may further comprise two input data stream nodes adapted to receive first and second input data streams.

The drive means may include two control nodes adapted to receive a first and second pump signals; the inverted pump signal being in anti-phase with the pump signal; first connecting means for connecting the pump input node to the first amplifier input; and second connecting means for connecting the inverted pump signal to the input node of the second amplifier.

The drive means may additionally include a third connecting means for connecting the first data signal to the first end of both amplifiers; and a fourth connecting means for connecting the second data signal to the second end of both the amplifiers.

The switch assembly may include first and second output nodes with fifth connecting means for connecting the first end of the first amplifier to the second output node, sixth connecting means for connecting the first end of the second amplifier to the first output node, seventh connecting means for connecting the second end of the first amplifier to the first output node; and eighth connecting means for connecting the second end of the second amplifier to the second output node.

Where two optical amplifiers are provided the invention provides an all optical 2×2 switch capable of operating in either a cross or bar configuration. The configuration of the switch is determined by the phase of the pump and inverted pump signals applied to the first and second amplifiers respectively relative to the phase of the data signals.

Semiconductor optical amplifiers (SOAs) are essentially laser diodes, without end mirrors, which have fiber attached to both ends. They amplify any optical signal that comes from either fiber and transmit an amplified version of the signal out of the other fiber. However, if the amplifier is saturated by a pump signal or inverted pump signal applied to one end it will not provide any additional amplification to the data stream signal applied to that amplifier. This effectively allows the amplifiers to be controlled such that only one is amplifying at any time (unsaturated) whilst the other is not applying any significant amplification (saturated).

The first amplifier and the amplifier may comprise semiconductor optical amplifiers having a saturation level lower than the level of the pump and inverted pump signal applied to the amplifier. The invention may therefore include a source of pump and inverted pump signals which are sufficient to saturate the chosen amplifiers.

The pump and inverted pump signals may comprise square wave signals. These may be in anti-phase to provide a desired inversion between the signals. The square wave may have a frequency equal to the rate at which signal packets are applied to the inputs of the switch.

The connecting means may comprise one or more optical waveguides, such as optical fibres.

Where two fibres are required to connect to one input node or to one output node, they may be joined by the use of a polarisation beam combiner.

The switch may be operable with input signals having a wavelength of between 1500 and 1600 nm, or between a smaller range of 1540 to 1565 nm. The amplifiers may be chosen such that they have an amplified spontaneous emission peak within this range, and preferably of around 1547 nm. This may be chosen to be close to or the same as the wavelength of the packetised data that is to be switched. Since the saturation of the amplifier does not necessarily depend on the wavelength of the pumps and the packets, they may be of the same or different wavelengths.

According to a second aspect the invention provides a network comprising first and second input signal lines, each carrying a data signal comprising packets of data, a switch assembly in accordance with the first aspect of the invention having first and second inputs, and a generator which generates a pump signal and an inverted pump signal, the generator generating signals that have the same frequency as the two input data streams.

The generator may produce a pump signal in which the duration of the high state of the pump signal exceeds the duration of the packets in the data stream so as to provide a guard time. This may exceed by a short period such as 1 μm.

A single generator may be used to produce both pump and inverted pump signals. Alternatively, a separate generator may be used for each one.

BRIEF DESCRIPTION OF THE DRAWINGS

There will now be described by way of example on embodiment of the present invention with reference to and as illustrated in the accompanying drawings of which:

FIG. 6 is an illustration of BER curves measured at the outputs in both the bar and cross configurations of the apparatus of FIG. 2.

DESCRIPTION OF AN EMBODIMENT OF THE INVENTION

Figure 1A:
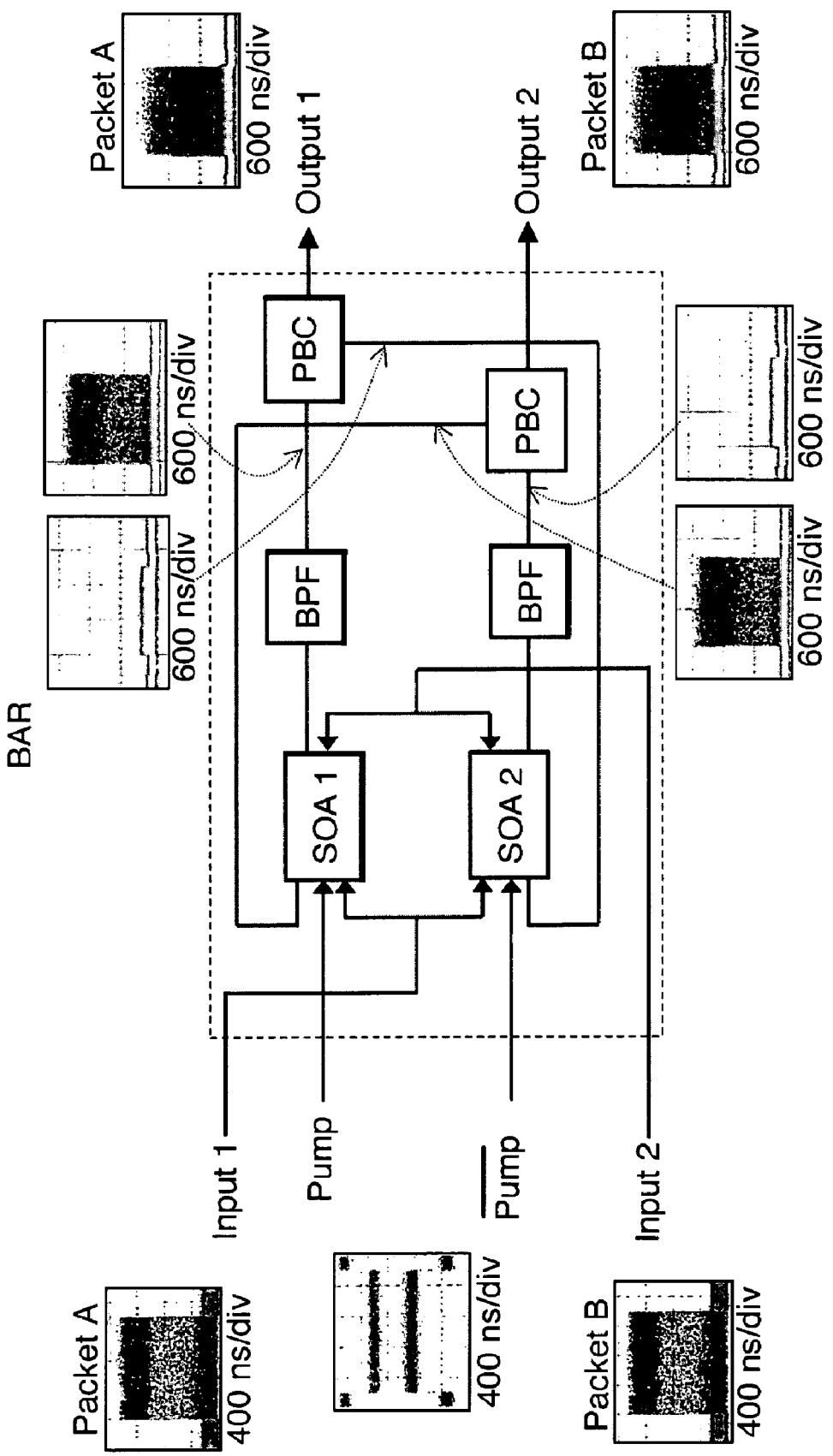
FIG. 1(a) is an overview of a switch assembly in accordance with the first aspect of the present invention in a bar configuration, and 1(b) is an overview of the same assembly in a cross configuration.

An optical switch assembly incorporated into an optical network is shown in FIGS. 1 (a) and 1(b) of the accompanying drawings. The network is adapted to carry packetised data between different nodes in the network, and the assembly is shown at one such node to provide routing of two streams of packetised data through the node. Each packet within a stream of packetised data generally comprises a data payload to be delivered, and a label carrying routing information. The label is read by processing circuitry (not shown) at the node and this information is used to configure the switch assembly. The function of the switch is to route the two input nodes to the appropriate two output nodes (which is sent where being dependent upon the configuration of the switch).

The switch comprises a pair of semiconductor optical amplifiers (10,20) arranged to provide a 2 by 2 assembly having bar and cross connection configurations. The bar configuration is shown in FIG. 1 (a) and the cross in FIG. 1(b). It can be seen that the two input signals Packet A and Packet B are routed to different output nodes in each configuration-passing straight through in BAR and switching over in CROSS configuration.

Figure 2:
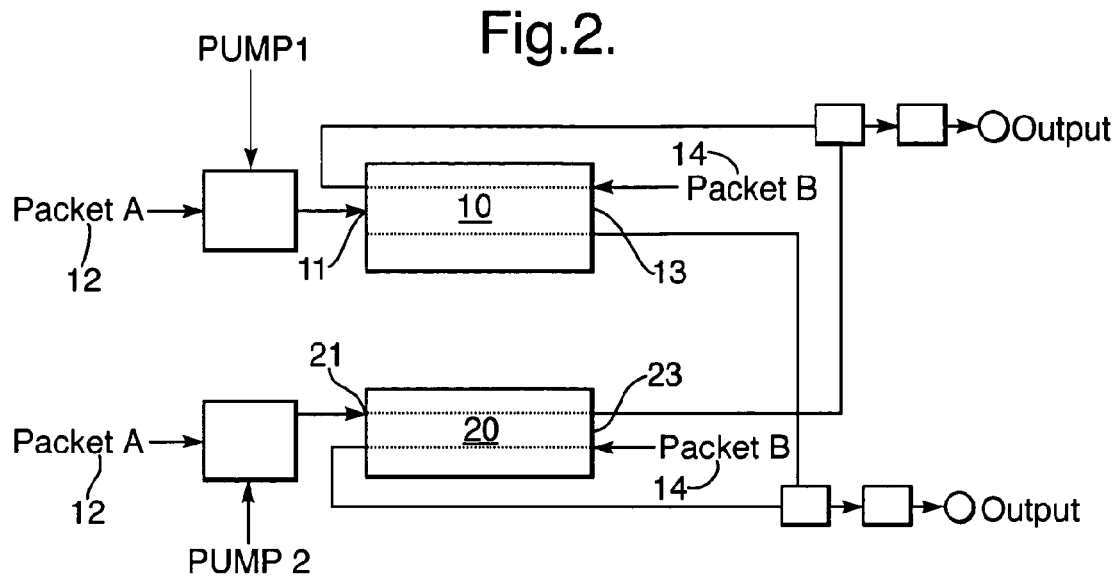
FIG. 2 is a schematic of a prototype switch assembly used to prove the concept of the assembly shown in FIGS. 1(a) and (b)

In more detail, as shown in FIG. 2, a prototype switching assembly has been constructed and tested. The prototype comprised two semiconductor optical amplifiers 10,20. These were of the Multi-Quantum Well (MQW) type with a small gain of 31 dB, a saturation power of 13 dBm and an ASE (Amplified Spontaneous Emission) peak at 1547 nm. A first end 11 of the first amplifier 10 is fed with a first packet signal 12 (A) and the second end 13 with a second packet signal 14 (B), these being the two signals that are to be routed through the switch assembly. The second amplifier 20 is connected the same way round, with the first signal 12 connected to a first end 21 and the second signal 14 to the second end 23. The two counter propagating packet signals flowing through each amplifier 10,20 are orthogonally polarised to minimise possible interference through reflections.

A pump signal (pump 1 or pump 2) is also connected to the first end of each of the two amplifiers. The pump signals of the prototype were produced using the arrangement of FIG. 3. A two into-one converter is provided for routing of this signal to the amplifier along with the packet signal that is already being supplied.

The function of the pump signals is to drive one or other of the amplifiers into a saturated state such that the packet signals propagating through the amplifier receive little or no amplification. To ensure that only one is saturated at a time one of the Pump signals (pump 2 in this case) is the inverse of the other pump signal (pump1). The pump (or inverted pump) polarisation state input to each SOA is chosen to maximise the effects of cross gain modulation within the SOA. The involved mean power for the signals and pump are −10 dBm and 11.5 dBm respectively at the amplifier inputs. The pump low level was also chosen to be offset from zero so as to fix the working point of the amplifiers to reduce the dynamics of gain recovery. This was found to reduce the signal distortions due to the SOA pattern effects and consequently to process the high performances at packet rates greater than 10 Gbits/s.

In use, at any one time one amplifier will be amplifying the counter propogating Packet A and Packet B signals propagating through it. The other will not. To exploit this, the first end of the first amplifier is connected to one output node along with the second end of the other. The second end of the first amplifier is connected to the other output node together with the first end of the second amplifier. Thus, depending on which is amplifying, the output at the nodes may be Packet A on one and Packet B on the other, or may be switched over.

Two polarisation beam combiners (pbc 1 and pbc 2) combine the two orthogonally polarised Packet signals that are fed to each output node. A band pass filter (bpf1 or bpf2) is located between the combiner and its output node to remove the pump signals from the outputs. Finally an amplifier, such as an erbium doped fibre amplifier, may be provided at the output node to boost the output to a useful level for onwards transmission across an optical network.

Figure 3:
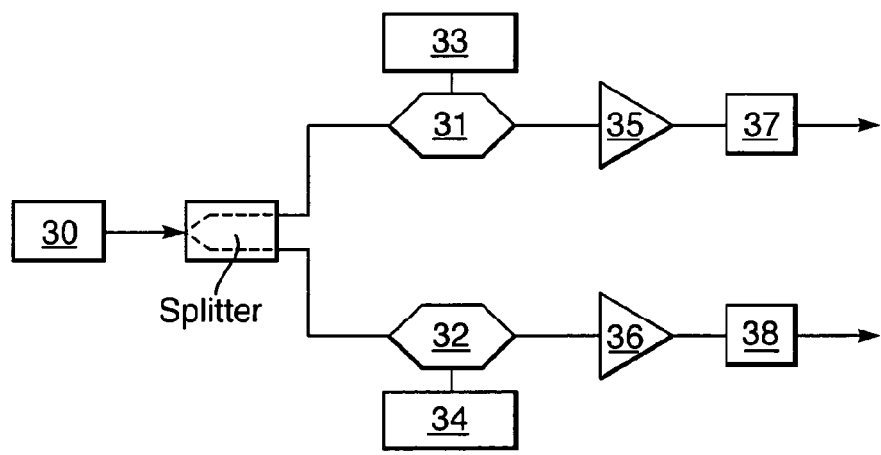
FIG. 3 is a schematic illustration of an optical circuit used to produce the pump signals required by the apparatus of FIG. 2.

In the prototype used to prove the concept, the pump signals are created using an optical apparatus arranged according to FIG. 3 of the accompanying drawings, The pump 1 (pump) and pump 2 (inverted pump) signals are square waveforms at λ=1550 nm with a frequency equal to the packet rate obtained by modulating the output of a continuous wave laser source 30 using two different Mach Zender (MZ) modulators 31,32 driven by square wave generators 33,34. In order to allow for the transition time of the square waveforms, the high-level part of the square wave is chosen to have a duration that exceeds the packet length. The two MZ modulators are driven in anti-phase to produce the inverted signals. The signals from each MZ modulator then pass through a respective Erbium doped fibre amplifier 35,36 and a band pass filter 37,38 before passing to the amplifiers.

Figure 4:
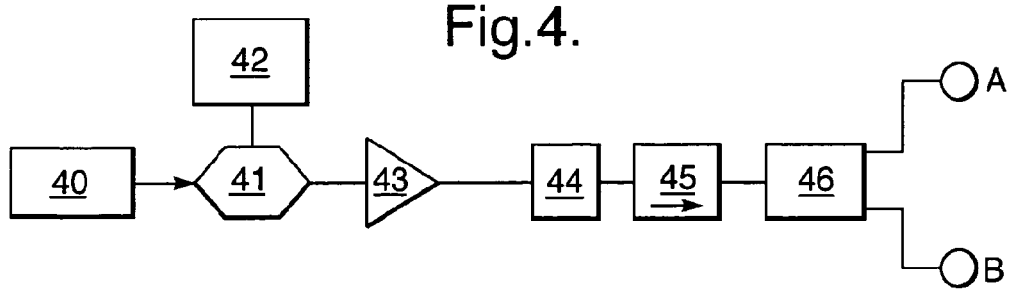
FIG. 4 is a schematic illustration of an optical circuit used to produce the packetised data signals supplied to the switch apparatus of FIG. 2.

The test apparatus employed an apparatus for creating the packet signals A and B as shown in FIG. 4 of the accompanying drawings. The two input signals consist of 1.5 μsecond long Non-Return to Zero (NRZ) payloads at 10 Gbps, generated by splitting a continuous wave (CW) laser 40 at λ=1548.5 nm modulated through a Mach Zender (MZ) modulator 41 by a ($2^{31}$−1) long pseudo Random bit sequence (PBRS). The packet is produced by a Bit Pattern generator 42 running in burst mode to simulate packet streams. The output of the MZ modulator is passed through an erbium doped fibre amplifier (EDFA) 43 and then a bandpass filter 44 before passing to a steerable beam splitter 45,46.

Experimental Results

Figure 5:
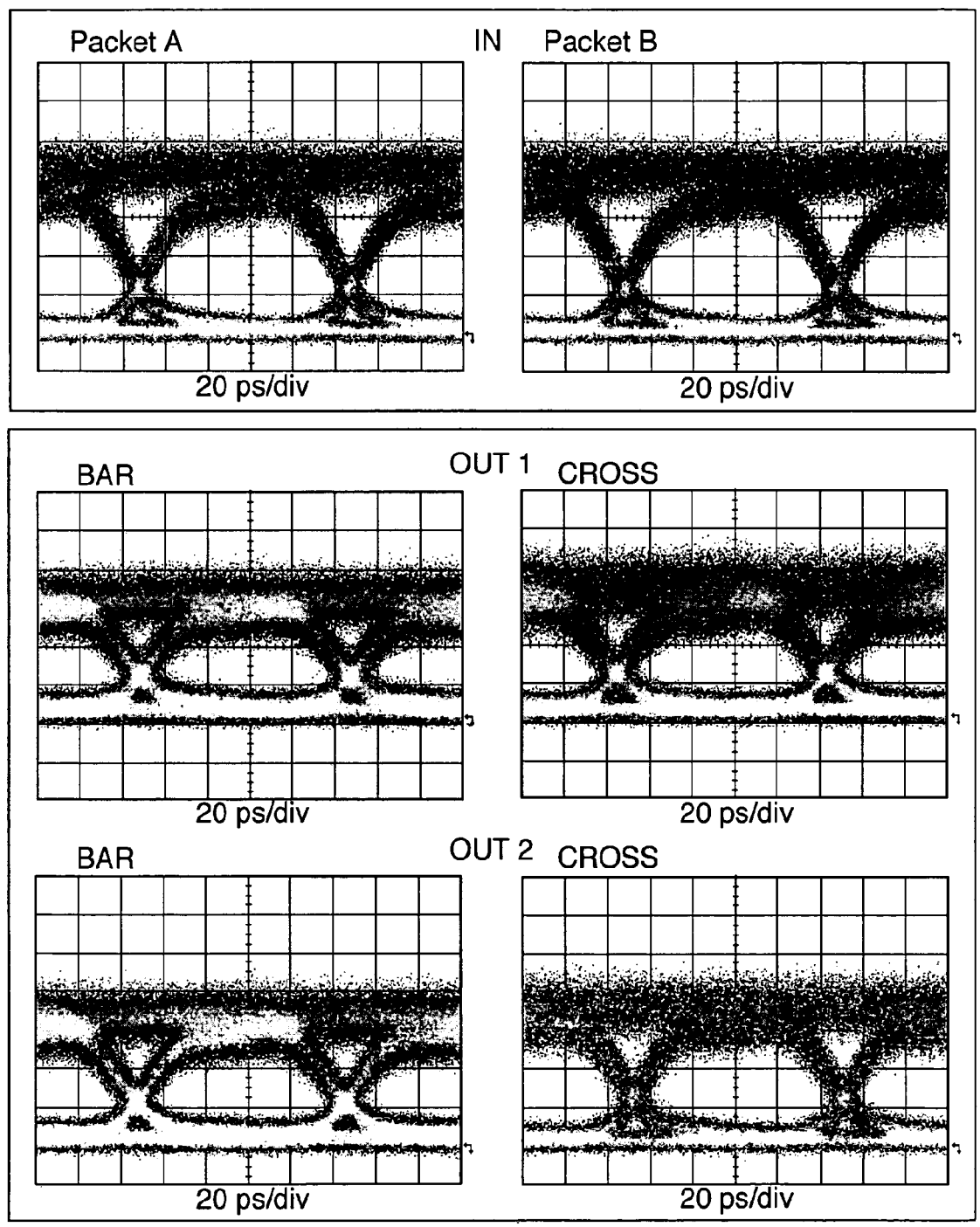
FIG. 5 is a set of eye diagrams of input packets A and B (top) and output packets in both the bar and cross configuration (bottom)

FIG. 5 of the accompanying drawings shows the input packets A and B together with the output packets in both the bar and cross configurations of the prototype switch apparatus. The mean power of reported signals is 6 dBm for input packets and 2 dBm for both packets at the output ports. The good eye diagram quality of both configurations, and the absence of beating noise at the outputs, confirm the effectiveness of the scheme.

Finally FIG. 6 of the accompanying drawings shows the BER measurements at each output port of the switch assembly in both the Bar and Cross configurations, in the case of an input wavelength equal to 1548.5 nm. The receiver used to obtain the readings comprised an optical pre-amplifier with 5 dB noise figure and a photoreceiver whose input power was kept to −16 dBm. In this configuration the maximum penalty at $10^{-9}$ is lower than 1 dB, which makes the switch assembly suitable for cascaded applications. The performance of the 2×2 all optical switch has been measured also for different signal wavelengths to be lower than 1.5 dB in the range λ=1540-1565 nm, making the proposed switch suitable for WM systems.

The invention claimed is:

1. An optical switch assembly comprising:
   at least two optical amplifiers;
   a first signal path configured to carry a first input signal to a first end of both amplifiers, and a second signal path configured to carry a second input signal to a second end of both amplifiers;
   a driver configured to simultaneously drive at least one of the two optical amplifiers into a saturated state while the other of the two optical amplifiers is in an unsaturated state, such that only the unsaturated amplifier amplifies the input signals at each end; and
   a combiner configured to feed the amplified output signals from the amplifiers to at least two output nodes such that the two optical amplifiers are connected to the two output nodes in opposite connections.

2. The optical switch assembly of claim 1 wherein the two optical amplifiers comprise at least two semiconductor amplifiers, each having an input node and an output node.

3. The optical switch assembly of claim 1 wherein the driver comprises:
   two control nodes configured to receive a first pump signal and a second pump signal, respectively, the second pump signal comprising an inverted pump signal that is in anti-phase with the first pump signal;
   a first connector configured to connect the first pump signal to the input node of the first amplifier input; and
   a second connector to connect the second pump signal to the input node of the second amplifier.

4. The optical switch assembly of claim 1 wherein the driver further comprises:
   a third connector configured to connect the first input signal to the first end of both amplifiers; and
   a fourth connector configured to connect the second input signal to the second end of both the amplifiers.

5. The optical switch assembly of claim 1 further comprising:
   first and second output nodes;
   a fifth connector configured to connect the first end of the first amplifier to the second output node;
   a sixth connector configured to connect the first end of the second amplifier to the first output node;
   a seventh connector to connect the second end of the first amplifier to the first output node; and
   an eighth connector to connect the second end of the second amplifier to the second output node.

6. The optical switch assembly of claim 3 wherein the pump signal and inverted pump signal comprise square wave signals.

7. A network comprising:
   first and second input signal lines, each carrying a data signal comprising one or more packets of data;
   a switch assembly configured to receive the packets of data, and comprising:
      at least two optical amplifiers;
      a first signal path configured to carry a first data signal to a first end of both amplifiers, and a second signal path configured to carry a second data signal to a second end of both amplifiers;
      a driver configured to simultaneously drive at least one of the two optical amplifiers into a saturated state while the other of the two optical amplifiers is in an unsaturated state, such that only the unsaturated amplifier amplifies the first and second data signals at each end; and
      a combiner configured to feed the amplified output signals from the amplifiers to at least two output nodes such that the two optical amplifiers are connected to the two output nodes in opposite connections; and
      a generator configured to generate a pump signal and an inverted pump signal, the generator generating signals that have the same frequency as the two input data streams.

8. The network of claim 7 wherein the generator produces the pump signal such that the duration of a high state of the pump signal exceeds the duration of the packets in the data stream so as to provide a guard time.

* * * * *